(12) United States Patent
Edelstein et al.

(10) Patent No.: US 6,251,787 B1
(45) Date of Patent: Jun. 26, 2001

(54) ELIMINATION OF PHOTO-INDUCED ELECTROCHEMICAL DISSOLUTION IN CHEMICAL MECHANICAL POLISHING

(75) Inventors: Daniel C. Edelstein, New Rochelle; Wilma J. Horkans, Ossining, both of NY (US); Stephen E. Luce, Underhill, VT (US); Naftall E. Lustig, Croton on Hudson, NY (US); Keith R. Pope, Danbury, CT (US); Peter D. Roper, Clinton Corners, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/514,867

(22) Filed: Feb. 28, 2000

Related U.S. Application Data

(62) Division of application No. 09/020,010, filed on Feb. 6, 1998, now Pat. No. 6,153,043.

(51) Int. Cl.[7] .................................................. H01L 21/00
(52) U.S. Cl. .......................... 438/692; 205/645; 205/662; 216/88; 216/85; 438/8; 438/745
(58) Field of Search .................................. 438/8, 14, 692, 438/693, 708, 745, 752, 753; 216/38, 88, 89, 84, 85; 156/345 LP; 205/640, 645, 655, 661, 662, 663

(56) References Cited

U.S. PATENT DOCUMENTS

| | | |
|---|---|---|
| 5,084,071 | 1/1992 | Nenadic et al. ........................ 51/309 |
| 5,139,571 | 8/1992 | Deal et al. ................................. 106/3 |
| 5,340,370 | 8/1994 | Cadien et al. ........................... 51/308 |
| 5,480,748 | 1/1996 | Bakeman, Jr. et al. ................ 430/11 |
| 5,527,423 | 6/1996 | Neville et al. ..................... 156/636.1 |
| 5,575,837 | 11/1996 | Kodama et al. ........................... 106/3 |

FOREIGN PATENT DOCUMENTS

| | | |
|---|---|---|
| 1-164039 | 6/1989 | (JP) . |
| 2-257613 | 10/1990 | (JP) . |
| 5-47735 | 2/1993 | (JP) . |
| 7-256260 | 1/1995 | (JP) . |

*Primary Examiner*—William Powell
(74) *Attorney, Agent, or Firm*—Schmeiser, Olsen & Watts; Howard J. Walter, Jr.

(57) ABSTRACT

Eliminating exposure of PN junctions to light capable of invoking a photovoltaic effect and/or inhibiting the oxidation and reduction reactions induced by the photovoltaic effect prevents the electrochemical dissolution of metal components on semiconductor devices by electrolysis. A darkened enclosure for use on tools for wafer CMP, brush cleaning, unloading, and rinsing will eliminate exposure. Alternatively, illumination of a semiconductor wafer can be limited to wavelengths of light that do not provide enough energy to induce a photovoltaic effect. An inhibitor in the CMP slurry and/or post-CMP water rinse blocks the oxidation and/or reduction reactions. A blocking agent, such as a high molecular weight surfactant, will interfere with both the oxidation and reduction reactions at the metal surface. Also, a poisoning agent will impede the reduction portion of electrolysis.

23 Claims, 4 Drawing Sheets

ELIMINATION OF PHOTO-INDUCED ELECTROCHEMICAL DISSOLUTION IN CHEMICAL MECHANICAL POLISHING

This application is a divisional application of the patent application Ser. No. 09/020,010 filed on Feb. 6, 1998, now U.S. Pat. No. 6,153,043

BACKGROUND OF THE INVENTION

1. Field of the Invention

The invention relates to the field of semiconductor fabrication. More particularly, the invention is a method for eliminating dissolution and/or corrosion of metallic conductors induced by light exposure of partially fabricated semiconductor devices.

2. Description of Related Art

In semiconductor device fabrication there is a constant need for methods to improve the reliability, yield and cost of fabrication while increasing feature density and decreasing feature size. One feature for which reliability is a great concern as its size decreases is the wiring that connects various devices on a chip. One method for creating this wiring is the damascene metal patterning processes. Today, the damascene process is used for a variety of wiring and contacts in semiconductor fabrication, replacing the more expensive traditional reactive ion etch (RIE) metal processing in products such as CMOS memory and logic.

Single damascene is defined as using the damascene process for global wiring and interconnects only. Dual damascene is where damascene wiring is combined with a damascene interconnect for even greater cost reduction.

The damascene metal process involves first etching a trench into a dielectric layer on a semiconductor wafer. The wafer is then covered with a conductor, this conductor filling the trench and covering the dielectric layer. The wafer is then polished, typically using a form of chemical mechanical polish (CMP), down to the dielectric layer. The dielectric layer, typically an oxide, is not as easily polished away by the CMP as the metal. Thus, the oxide serves as a "stop" for the polish process. The CMP leaves the conductor embedded as wires in the dielectric. This process can be used to create global wiring, interconnects, and contacts. The damascene process has been used extensively with tungsten or aluminum as the conductor and silicon dioxide as the dielectric.

As integrated circuit devices and the associated metal lines become smaller, the relatively low conductivity of the tungsten or aluminum begins to become an issue. Because of its better conductivity, copper is a desirable conductor in the damascene process as feature size shrinks. Accordingly, it is also desirable as a conductor in other processes for forming wiring, interconnects, and contacts. However, copper is more susceptible to corrosion than metals used previously, such as tungsten, and its corrosion presents a senous manufacturing problem. Corrosion leads to pitting, that adversely affects the electrical properties of the lines, and also leads to opens in lines. Generally, the CMP environment is corrosive to copper and other metals, so corrosion inhibitors are included with the CMP slurry to prevent unwanted corrosion of metal. Surprisingly, conventional inhibitors are at times ineffective in protecting copper. Also, it is expected that the problem will exist for other metals or alloys susceptible to corrosion that may replace copper in the future. Unless the source of the copper damage can be diagnosed and remedied, serious limitations might be placed on reducing feature size in integrated circuit devices, hampering improvements in device technology. Thus, it can be seen from the above discussion that it would be an improvement in the art to prevent damage to corrosion susceptible metals during fabrication of semiconductor devices.

SUMMARY OF THE INVENTION

Accordingly, the present invention provides eliminating the exposure of PN junctions to light capable of invoking a photovoltaic effect thus preventing the electrochemical dissolution of metal components. The invention also provides prevention of this photo-driven dissolution by introducing inhibitors both for the oxidation reaction (electrochemical dissolution of metal) and for the accompanying reduction reaction that completes the circuit in the electrochemical cell formed in the CMP environment.

The invention provides implementation of a darkened enclosure, such as a box or curtains, for use on tools for wafer CMP, brush cleaning, unloading, and rinsing. Alternatively, illumination of the wafer can be limited to wavelengths of light that do not provide enough energy to promote any electrons in the PN junction from the valence band to the conduction band. If no conducting electrons are generated, then no current will be induced in the PN junction and no electrochemical reactions will occur.

The invention also provides use of an inhibitor in the CMP slurry and/or post-CMP water rinse. By using an inhibitor prior to exposure of PN junctions on the wafer to light, the electrochemical dissolution reaction may be prevented once a current is induced in the PN junction. In one embodiment, a blocking agent, such as a high molecular weight surfactant, is added to interfere with both the oxidation and reduction reactions.

In another embodiment, a poisoning agent is used to impede the reduction portion of the electrochemical cell.

It is an advantage of the present invention that electrolysis and the consequent dissolution of metal on semiconductor devices may be prevented.

It is a further advantage that the methods and apparatus of the present invention may be used individually or in combination for maximum effect.

The foregoing and other features and advantages of the present invention will be apparent from the following more particular description of preferred embodiments of the invention, as illustrated in the accompanying drawings.

BRIEF DESCRIPTION OF THE DRAWINGS

The preferred embodiments of the present invention will hereinafter be described in conjunction with the appended drawings, wherein like designations denote like elements, and.

DESCRIPTION OF THE PREFERRED EMBODIMENTS

Figure 1:
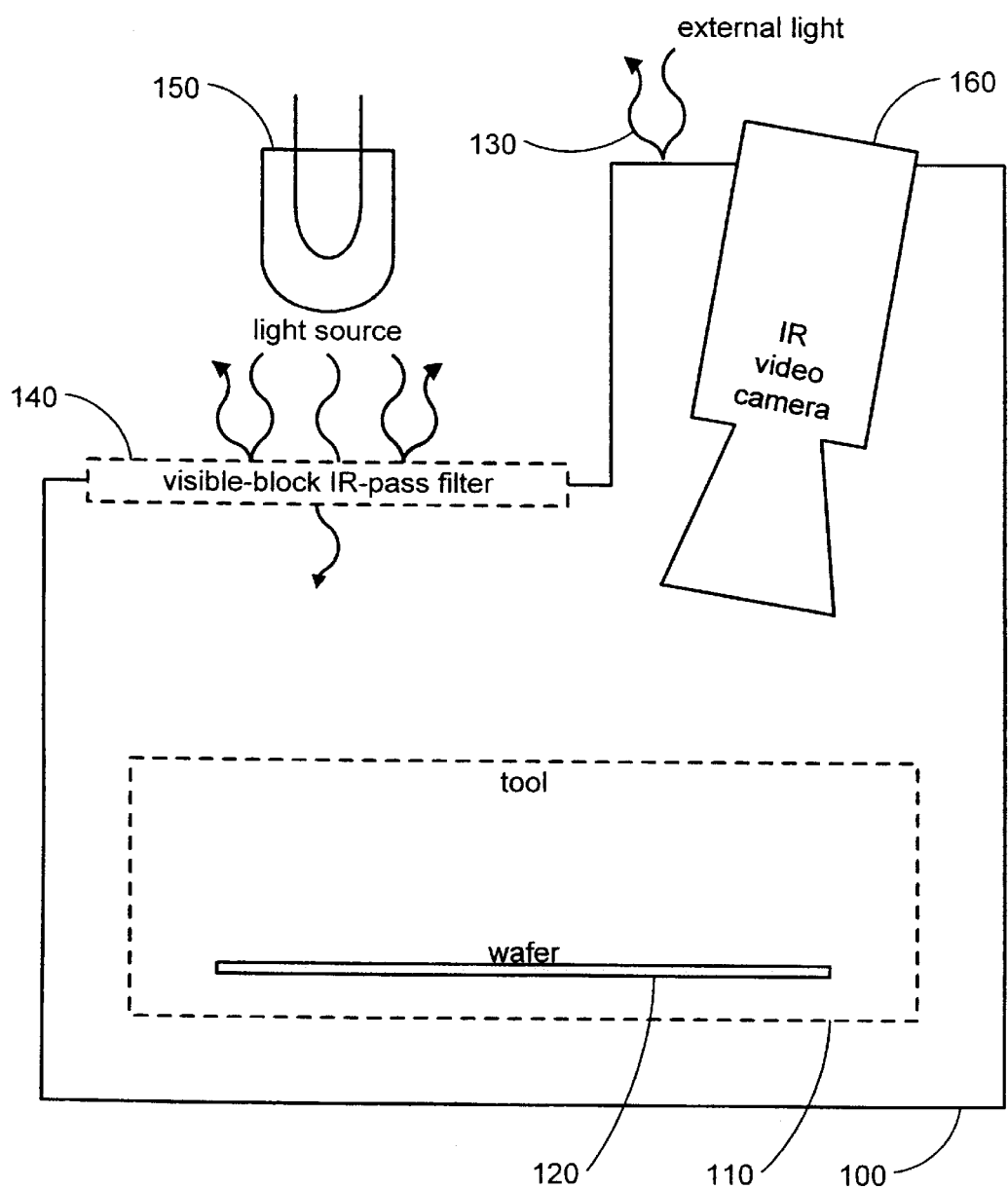
FIG. 1 is a diagram of a dark BEOL process according to the present invention.

As experimentation began with copper as a material for wiring and interconnects, test wafers were fabricated using CMP with only metal lines or wiring and no integrated circuit devices. Favorable results led to fabrication of wafers with active circuitry such as transistors, resistors, capacitors, etc. Localized metal corrosion was observed on the wafers with active circuitry that did not appear on the test wafers without active circuitry. Similar effects were observed in aluminum conductors. Once lifted from a CMP platen, during brush cleaning, and during rinsing, a semiconductor wafer is exposed both to light and to an electrolyte, such as the CMP slurry or water. Upon investigation, it was determined that electrochemical dissolution was occurring as a result of electrolysis. Further, the dissolution occurred despite the presence of corrosion inhibitors that were sufficient to prevent corrosion of metal features on wafers without active circuitry.

Theoretical Foundation

It is well known that, in certain environments, some materials undergo electrochemical corrosion. Corrosion is a process that occurs at open circuit, that is, there is no net flow of current. Rather, both an anodic and a cathodic reaction occur on the surface of the corroding material. These two reactions are interrelated in that the electrical charge passed in each reaction is equal but of opposite sign. Further, if either reaction can be prevented, then the overall corrosion reaction will be prevented.

By definition, the anodic reaction involves oxidation, typically of a solid metal, and takes place at the anode. The oxidation or anodic reaction may be described as $$M \rightarrow M^{n+} + ne^- \quad \text{(Equation 1)}$$

where M is a metal atom, $e^-$ is an electron, and n is an integer. Notably, electrons are produced by oxidation at the anode. By definition, the cathodic reaction involves reduction and takes place at the cathode. There are many possibilities for reduction or cathodic reactions, depending on the constituents in the electrolyte to which the metal is exposed; a few examples are indicated below. The reduction of oxygen to water in acid solutions may be described as $$O_2 + 4H^+ + 4e^- \rightarrow 2H_2O \quad \text{(Equation 2)}$$

where O is oxygen and H is hydrogen. The reduction of oxygen to water in alkaline solutions may be described as $$O_2 + 2H_2O + 4e^- \rightarrow 4OH^- \quad \text{(Equation 3)}$$

Oxygen may also be only partially reduced by the pathways $$O_2 + 2H^+ + 2e^- \rightarrow H_2O_2 \quad \text{(Equation 4)}$$

in acid media, or $$O_2 + 2H_2O + 2e^- \rightarrow H_2O_2 + 2OH^- \quad \text{(Equation 5)}$$

in basic media. The reduction reaction may alternatively be $H_2$ evolution through $$2H^+ + 2e^- \rightarrow H_2 \quad \text{(Equation 6)}$$

in acidic media, or $$2H_2O + 2e^- \rightarrow H_2 + 2OH^- \quad \text{(Equation 7)}$$

in basic media. Notably, electrons are consumed by reduction at the cathode.

Corrosion of the metal only occurs when both oxidation and reduction reactions proceed. The overall electrochemical corrosion reaction of copper, for example, may typically be described as $$2Cu + O_2 + 4H^+ \rightarrow 2Cu^{2+} + 2H_2O \quad \text{(Equation 8)}$$

or $$2Cu + O_2 + 2H_2O \rightarrow 2Cu^{2+} + 4OH^- \quad \text{(Equation 9)}$$

for corrosion of copper (Cu) in an acid or alkaline solution, respectively, where $Cu^{2+}$ is the free cation corroded away from the solid metal Cu. Equation 8 and 9 are combinations of the copper oxidation reaction described generically by Equation 1 and the oxygen reduction reactions described by Equations 2 and 3. Over time, such a reaction will result in pitting and/or dissolution of the copper into solution.

The occurrence of corrosion reactions is governed by the laws of thermodynamics, that is, a corrosion reaction will only proceed if it produces a negative free-energy change. For example, the reaction described by Equation 9 produces a negative free energy change and will proceed spontaneously.

Electrolysis, in contrast to corrosion, is an electrochemical process in which a current source produces a net flow of current. In corrosion, the anodic and cathodic reactions take place in close proximity on the same surface. In electrolysis, the anodic and cathodic reactions take place on distinctly separated electrodes that are connected to the current source. (See FIG. 2). The electrolytic solution to which both electrodes are simultaneously exposed completes the electrochemical circuit.

In electrolysis, a very large number of anodic and cathodic reactions are possible. In the case of dissolution of metal, the anodic reaction would be Equation 1. The anodic reaction is characterized by its thermodynamic reversible potential, $E_r^a$. By definition, the net current flow at equilibrium is zero. The potential at which the anodic reaction proceeds is $E^a$, which is $E_r^a + \eta^a$. The overpotential $\eta^a$ has contributions from the reaction kinetics and from other factors like IR (i.e., IR=V, the potential drop caused by flow of the current through the resistive electrolyte). The cathodic reactions pertinent to the invention may be equations 2 through 7, and also, if there are metal ions present in the solution:

$$M^{m+} + ne^- \rightarrow M \quad \text{(Equation 10)}$$

The cathodic reaction is also a characterized by its thermodynamic reversible potential, $E_r^c$, but actually proceeds at a potential $E^c = E_r^c + \eta^c$. In order for an overall electrochemical dissolution reaction, as exemplified by Equation 9, to proceed, the power supply must provide a voltage at least equal to $E^{cell} = E^a + E^c$.

Figure 2:
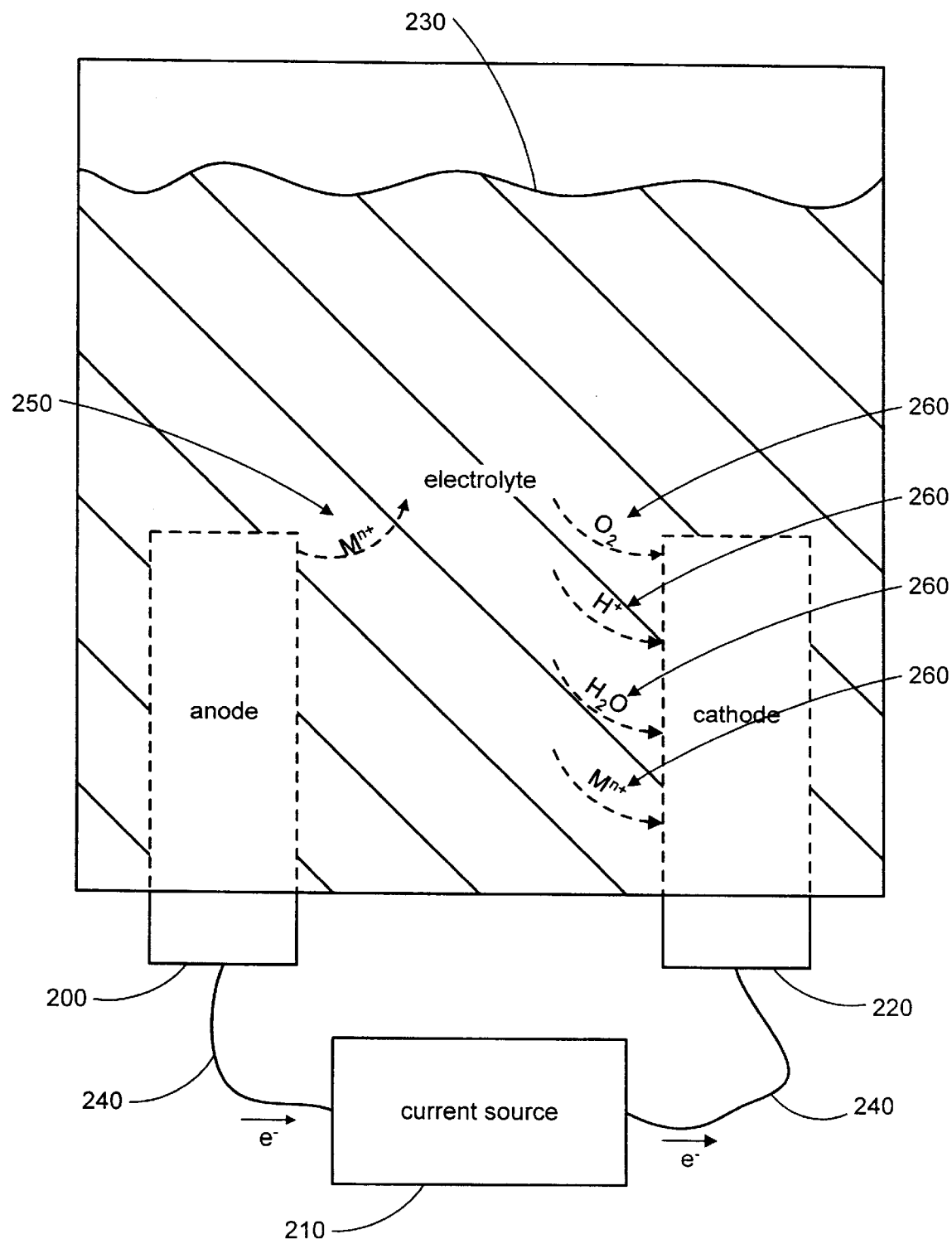
FIG. 2 is a diagram of an electrolytic cell.

As shown in FIG. 2, electrolysis occurs when an electrical circuit is formed containing an anode 200 and a cathode 220 both having an internal connection 240 to a current source 210. A conduction path between anode 200 and cathode 220 is provided through electrolyte 230. Current is conducted through internal connection 240 by electrons or holes and through electrolyte 230 by ions.

Upon supplying a sufficient voltage between anode 200 and cathode 220 by current source 210, oxidation of the anode metal (or other anode material) will occur. The oxidation reaction at anode 200 yields free cations 250 that dissolve into electrolyte 230 and electrons that flow through internal connection 240 to current source 210 and on to cathode 220. The oxidation reaction causes the most visible indicator of electrolysis, that is, dissolution or pitting of anode 200, but a reduction reaction must also occur. The reduction reaction at cathode 220 combines electrons with reactants 260 in electrolyte 230 to yield the reduced reaction product. Specifically, the reduction reaction may occur as in Equation 3 where $O_2$ is the reactant and $OH^-$ is the reduced reaction product. Additionally, the reduction reaction may occur as indicated in FIG. 2 and Equations 3 to 7 and Equation 9 where $H^+$, $H_2O$, and $M^{n+}$ may also be reactants 260. By this means, the anode metal may dissolve away through a mechanism other than corrosion. The potential required is determined by the thermodynamic reversible potentials and the overpotentials of the anodic and cathodic reactions as discussed above.

Figure 3:
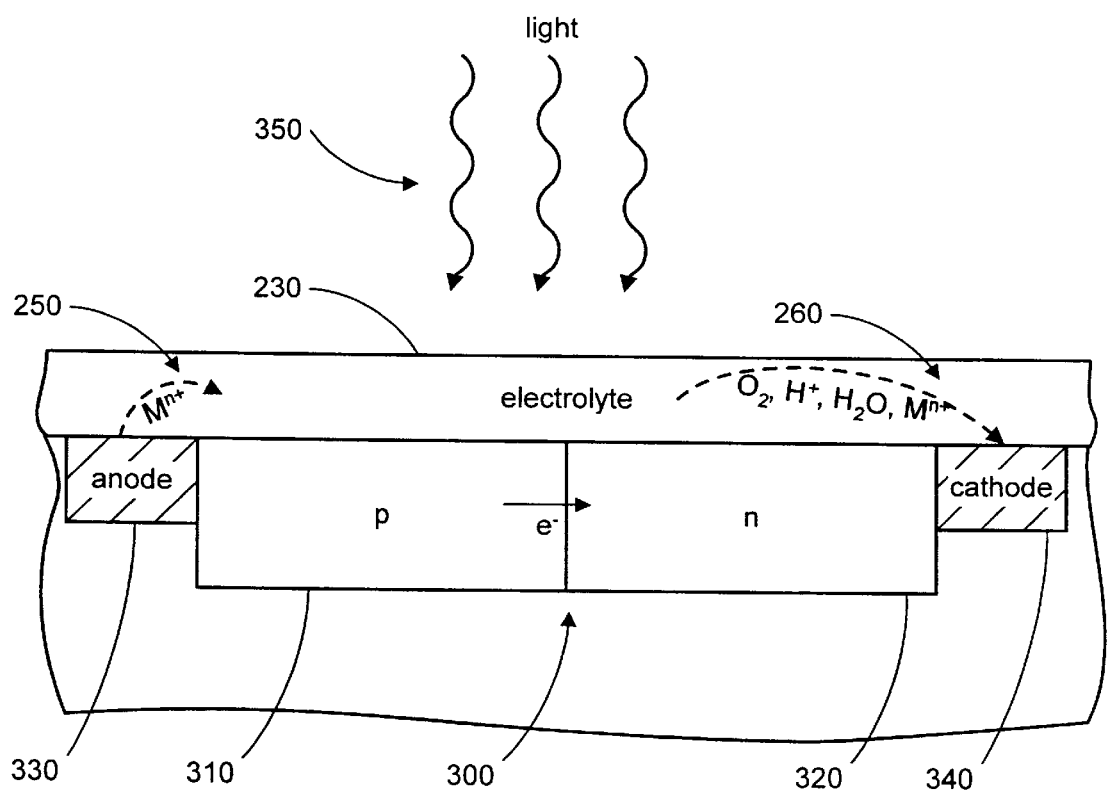
FIG. 3 is a cross-sectional view of an exemplary PN junction.

Semiconductor devices are typically formed by selectively introducing impurity atoms, known as dopants into the Si wafer. These dopants create n-type and p-type regions in the wafer. At the interfaces where the various n-type and p-type regions are juxtaposed, a PN junction is formed. These junctions are typically formed throughout the wafer. FIG. 3 shows an exemplary PN junction 300 that can be used to illustrate what occurs in any of the PN junctions on the wafer. PN junction 300 includes a p-type semiconductor material 310 juxtaposed with n-type semiconductor material 320. Metal interconnects 330, 340 are illustrative of metal connectors that may be juxtaposed with any of the n-type or p-type material formed throughout the wafer. For example, the metal contacts can serve as contacts to the device of which PN junction 300 is a part. One interesting characteristic of PN junctions is that they exhibit a photovoltaic effect under certain conditions. That is, when exposed to light energy, the electrons in the PN junction are excited into a higher energy level and then, because of a built-in electric field at the junction, the electrons migrate across the interface, producing current. The photovoltaic effect essentially turns PN junction 300 into a battery supplying current to metal interconnects 330, 340. If there is also a surface layer of electrolyte 230 present that can complete the conduction path, then metal interconnects 330, 340 become an anode 330 and a cathode 340.

In a crystalline solid, such as the materials that make up an integrated circuit, the atomic orbitals in effect combine into continuous "bands" of "crystal" orbitals or electron energy levels. The highest occupied band is called the valence band and the lowest vacant band is called the conduction band. The amount of energy required to promote one electron from the highest point in the valence band to the lowest point in the conduction band is called the band gap energy ($E_g$). For silicon, $E_g$=1.12 eV at room temperature, while for gallium arsenide $E_g$=1.42 eV at room temperature. Semiconductive materials, such as silicon, are known to exhibit photoconductivity wherein light illumination provides enough energy to excite electrons into the conduction band and to increase the electrical conductivity of the semiconductor. Light energy is related to the frequency or wavelength of the light according to the equations $E=h\nu$ or $E=hc/\lambda$, where h is the Planck constant, c is the speed of light, $\nu$ is frequency, and is $\lambda$ wavelength. For most silicon-based semiconductors at room temperature, the light energy needed to achieve photoconductivity must reach approximately 1.12 eV or, in other words, have a wavelength less than or equal to approximately 1.1 $\mu$m. For gallium arsenide semiconductors, photoconductivity requires a wavelength less than or equal to approximately 0.9 $\mu$m. For other semiconductors, $E_g$ is readily available in common references and wavelength can be calculated using the above equations. While the remaining discussion centers on silicon-based semiconductor devices, it will be understood by those skilled in the art that the invention is equally applicable to devices fabricated with other semiconductor materials, such as gallium arsenide.

The photoconductivity discussed above provides the basis for the photovoltaic effect in a PN junction 300. A n-type semiconductor 320 is silicon doped with a donor impurity, such as phosphorous or arsenic, that donates an electron to the silicon conduction band, creating an extra negative charge carrier. Accordingly, the majority charge carriers in n-type semiconductor 320 are negatively charged particles. A p-type semiconductor 310 is silicon doped with an acceptor impurity, such as boron, that accepts an electron from the silicon valence band, creating an extra electron hole or positive charge carrier. Accordingly, the majority charge carriers in p-type semiconductor 310 are positively charged electron holes. When PN junction 300 is illuminated by photons of light 350 having sufficient energy, electrons are promoted from the valence band to the conduction band in both p-type 310 and n-type 320 semiconductor materials, leaving behind electron holes. The additional positive charge carriers thus created in n-type semiconductor 320 migrate to the p-type 310 side of junction 300 where the majority charge carriers are positive (electron holes). Also, the additional negative charge carriers thus created in p-type semiconductor 310 migrate to the n-type 320 side of junction 300 where the majority charge carriers are negative (electrons). This migration of charge carriers constitutes the photovoltaic effect and creates a current source analogous to a battery.

When the PN junction acting as a current source is connected to metal conductors, such as interconnects 330, 340, that are exposed to an electrolyte 230, all the elements needed for electrolysis are present and dissolution of the anodic metal components will occur if the potential is sufficient. The electrochemical dissolution of FIG. 3, driven by a photovoltage, is analogous to the electrochemical dissolution of FIG. 2. The oxidation reaction at anode 330 yields free cations 250 that dissolve into electrolyte 230 and electrons that flow through the internal connection to the current source (PN junction 300) and on to cathode 340. The oxidation reaction causes the most visible indicator of electrolysis, that is, dissolution or pitting of anode 330, but a reduction reaction must also occur. The reduction reaction at the cathode combines electrons with reactants 260 in electrolyte 230 to yield the reduced reaction product. Note that some of the metal conductors become anodes and some become cathodes, depending upon whether they are connected to the p side or to the n side of the PN junction.

Elimination or Reduction of Electrochemical Dissolution

According to a preferred embodiments of present invention, a method and apparatus for eliminating or reducing electrochemical dissolution of global wiring, interconnects, contacts, and other metal features are provided. The preferred embodiment reduces dissolution by eliminating exposure of PN junctions to light capable of invoking a photovoltaic effect and/or inhibiting the oxidation and/or the reduction induced by the photovoltaic effect. A preferred embodiment of the method and apparatus are described in FIGS. 1 to 4 and the explanation below.

During front-end-of-line (FEOL) processing, integrated circuit devices are formed in silicon wafers. Once the devices are formed they are connected together with global wiring, interconnects, contacts, and other metal features during back-end-of-line (BEOL) processing. In a preferred embodiment, the wiring and interconnects are formed using a dual damascene process. The dual damascene metal process involves first etching a trench and contact hole into a dielectric layer on a semiconductor wafer. The wafer is then covered with a conductor, this conductor filling the trench and contact hole and covering the dielectric layer. The wafer is then polished, typically using CMP, down to the dielectric layer. The CMP leaves the conductor embedded as wires and interconnects in the dielectric.

Figure 4:
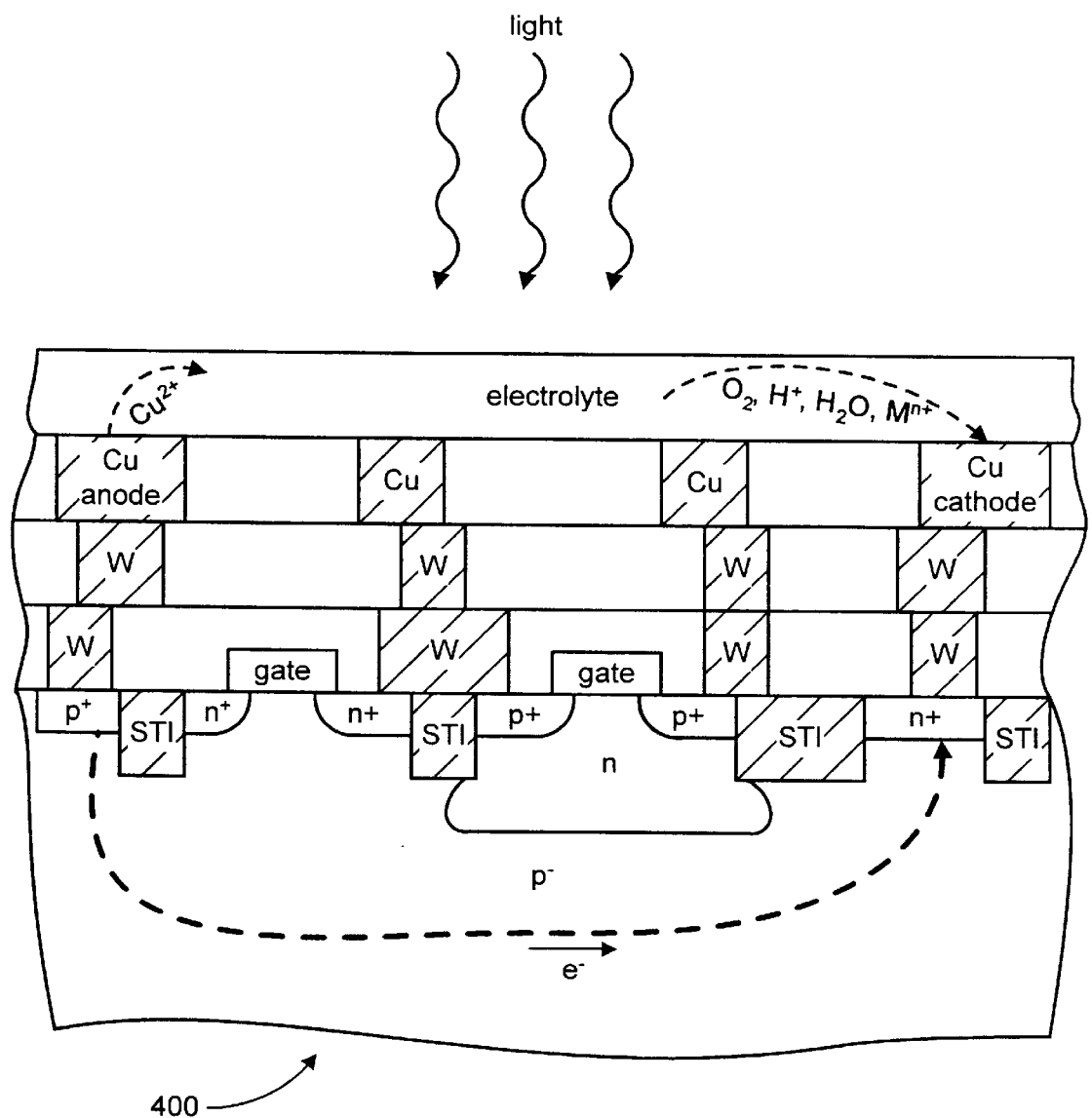
FIG. 4 is a cross-sectional view of an exemplary FEOL wafer during BEOL processing.

FIG. 4 is a cross-sectional view of a wafer portion 400 formed by dual damascene and CMP and includes exemplary features of typical integrated devices. In particular, wafer portion 400 includes several doped semiconductor regions. The doped regions form n-type and p-type regions that, in turn, define the devices, drains, wells, and contacts for the various transistors. As such, wafer portion 400 includes many PN junctions. Also, "STI" in FIG. 4 denotes "shallow trench isolation" and "gate" denotes the gate of a field effect transistor (FET). "W" and "Cu" denote conductive material made from tungsten and copper, respectively. The conductive material, in turn, denotes a plurality of wiring and interconnects used to connect the illustrated devices with other devices (not shown) on the wafer portion 400.

Essentially, FIG. 4 describes two FETs, including the p-type and n-type material associated with the FETs and the STIs separating the FETs, along with the conductive, semiconductive, and insulating material forming other devices on the wafer not shown in the cross-section. Electrolysis as discussed herein may occur in FEOL wafers having device structures entirely different from that shown in FIG. 4, provided the theoretical operation shown in FIG. 3 is present. The importance of FIG. 4 is that it shows p-type and n-type semiconductors juxtaposed and connected with copper interconnects exposed to an electrolyte. When illuminated, the FEOL wafer in FIG. 4 will undergo electrolysis.

In conventional processing, wafer portion 400 is typically exposed to light at several instances. While polishing off the blanketed material on the FEOL wafer, the wafer is pressed against a polishing platen and, accordingly, shielded from any light. Once lifted from the platen, during brush cleaning, and during rinsing, the wafer is exposed both to light and to an electrolyte, such as the CMP slurry or water. It was observed that exposure of the wafer after polishing resulted in opens or substantial dissolution of metal features. Upon investigation, it was determined that the dissolution was occurring as a result of electrolysis. Further, the dissolution occurred despite the presence of BTA that previously was sufficient to prevent corrosion of metal features. This surprising discovery resulted in development of methods and apparatus for protecting copper and aluminum features on FEOL wafers from damage during BEOL processing. Notably, the methods and apparatus are equally applicable to features made with other metals and to processes using methods other than CMP where a PN junction is exposed to light, causing electrochemical dissolution of metal features.

According to the preferred embodiment, one measure that reduces electrochemical dissolution is eliminating exposure of PN junctions to light capable of invoking a photovoltaic effect. A preferred embodiment provides implementation of a darkened enclosure 100 shown in FIG. 1, such as a box or curtains, for use on a tool 110 for wafer CMP, brush cleaning, unloading, and rinsing. By eliminating exposure of PN junctions on wafer 120 to light 130, even though an electrolyte may be present, no photovoltaic effect will occur and dissolution can be eliminated. Alternatively, illumination of the wafer can be limited to wavelengths of light that do not provide enough energy to satisfy $E_g$, preventing the promotion of any electrons in the PN junction from the valence band to the conduction band. If no electrons are promoted, then no current will be induced in the PN junction. For example, near infrared light at wavelengths of greater than approximately 1.1 $\mu$m may be used without concern for electrolysis. Infrared light may be produced by any known method such as placing a visible-block, infrared-pass filter 140 on a light source 150 such as a standard incandescent or halogen lamp. The advantage of using infrared light is that an infrared video camera 160 could then be used for monitoring a "dark" CMP process such as that described. Also, in circumstances when a "hot" light is desired for rapid drying, it may continue provided the wavelength is greater than approximately 1.1 $\mu$m.

Also according to the preferred embodiment, a second measure that reduces electrolysis is inhibiting the oxidation and/or the reduction reaction induced by the photo-generated voltage. The invention provides use of an inhibitor in the CMP slurry and/or post-CMP water rinse. Using an inhibitor prior to exposure of PN junctions on the wafer to light increases the anodic overpotential, $\eta^a$, and/or the cathodic overpotential, $\eta^c$. The overpotentials can be increased by, among other mechanisms, passivating the anode, forming a film on the anode, scavenging oxygen from the electrolyte, adsorbing a blocking species on the anode or cathode, and slowing the reaction kinetics of the anodic or cathodic reaction.

Increasing the overpotentials $\eta^a$ and/or $\eta^c$ results in an increase in the voltage $E^{cell}$ required to pass current through the electrochemical circuit. At some value of the combined overpotentials, the photovoltage of the PN junction will be insufficient to pass current. At this point electrolysis, and the consequent electrochemical dissolution, stop.

In one embodiment of an inhibitor, a small amount of a blocking agent is added to interfere with both the oxidation and reduction reactions. A suitable blocking agent is a high molecular weight surfactant that will tend to accumulate at the interface between the wafer surface and the electrolyte (CMP slurry or rinse water) and actively bind with the bare metal surfaces. The effect of the surfactant may be to alter the surface environment by displacing water molecules. As a result, the electrode kinetics are slowed both for electrochemical dissolution of metals and for cathodic reactions like oxygen reduction. Impeding the electrode kinetics for either reaction causes an increase in the overpotential and thus a decrease in the current driven by the photovoltage of the PN junction. In general, sodium salts of sulfated fatty alcohols are suitable surfactants, particularly sodium alkyl sulfates, and more particularly sodium octyl sulfate.

In another embodiment of an inhibitor, a poisoning agent is used to impede the reduction portion of the electrolysis. For example, lead ions, $Pb^{2+}$, in the CMP electrolyte impede reduction of reactants at the cathode and, thus, affect the overall electrolysis reaction in a manner analogous to that discussed above. Other suitable poisoning agents include $Bi^{3+}$, $Cd^{2+}$, $Sb^{3+}$, $As^{3+}$, and $Tl^{1+}$. Poisoning species like lead ions serve to increase the cathodic overpotential $\eta_c$ because the oxygen reduction reaction can proceed at significant rates only on surfaces that are good catalysts and that lower the energy of activation for the reaction. Absorbed lead ions poison the catalytic activity of the copper surface for oxygen reduction. The lead on the surface prevents the surface interactions that are required to form $H_2O$ from $O_2$. Accordingly then, the reduction portion of electrolysis is inhibited and electrochemical dissolution may be prevented.

While the invention has been particularly shown and described with reference to preferred embodiments thereof, it will be understood by those skilled in the art that various changes in form and details may be made therein without departing from the spirit and scope of the invention. For example, it will also be understood by those skilled in the art that the invention is applicable to different isolation technologies (e.g., LOCOS, recessed oxide (ROX), etc.), well and substrate technologies, dopant types, energies and species. It will also be understood that the spirit of the invention is applicable to other semiconductor technologies (e.g., BiCMOS, bipolar, silicon on insulator (SOI), silicon germanium (SiGe). Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A method for reducing electrolysis between metal features in semiconductor material comprising limiting exposure of a semiconductor material to light having energy greater than or equal to a band gap energy of the semiconductor material.

2. The method of claim 1, wherein the step of limiting exposure comprises stationing an enclosing mechanism about a semiconductor processing tool selected from the group consisting of a chemical mechanical polisher and a brush cleaner.

3. The method of claim 2, wherein the step of limiting exposure additionally comprises illuminating the semiconductor processing tool only with a light source capable of producing light having energy less than the band gap energy.

4. The method of claim 3, additionally comprising the step of monitoring the semiconductor processing tool with a video camera capable of detecting light having energy less than the band gap energy.

5. The method of claim 4, wherein the semiconductor material is silicon-based, wherein the enclosing mechanism eliminates light having a wavelength less than or equal to approximately 1.1 μm, and wherein the light source produces and the video camera detects light having a wavelength greater than approximately 1.1 μm.

6. The method of claim 4, wherein the semiconductor material is gallium arsenide-based, wherein the enclosing mechanism eliminates light having a wavelength less than or equal to approximately 0.9 μm, and wherein the light source produces and the video camera detects light having a wavelength greater than approximately 0.9 μm.

7. A method for reducing electrolysis between metal features in semiconductor material comprising associating at least one electrolysis inhibitor with metal features in a semiconductor material.

8. The method of claim 7, wherein the semiconductor processing tool is selected from the group consisting of a chemical mechanical polisher and a brush cleaner.

9. The method of claim 8, wherein the electrolysis inhibitor is independently selected from the group consisting of blocking agents and poisoning agents.

10. The method of claim 9, wherein any blocking agent is selected from the group consisting of high molecular weight surfactants.

11. The method of claim 10, wherein the blocking agent is selected from the group consisting of sodium salts of sulfated fatty alcohols.

12. The method of claim 11, wherein the blocking agent is sodium octyl sulfate.

13. The method of claim 9, wherein any poisoning agent is selected from the group consisting of $Pb^{2+}$, $Bi^{3+}$, $Cd^{2+}$, $Sb^{3+}$, $As^{3+}$, and $Tl^{1+}$.

14. The method of claim 13, wherein the poisoning agent is $Pb^{2+}$.

15. The method of claim 7, further comprising limiting exposure of the semiconductor material to light having energy greater than or equal to a band gap energy of the semiconductor material.

16. The method of claim 15, wherein the step of limiting exposure comprises stationing an enclosing mechanism about a semiconductor processing tool selected from the group consisting of a chemical mechanical polisher and a brush cleaner.

17. The method of claim 15, wherein the step of limiting exposure comprises illuminating the semiconductor processing tool only with a light source capable of producing light having energy less than the band gap energy.

18. The method of claim 17, additionally comprising the step of monitoring the semiconductor processing tool with a video camera capable of detecting light having energy less than the band gap energy.

19. The method of claim 18, wherein the semiconductor material is silicon-based, wherein the enclosing mechanism eliminates light having a wavelength less than or equal to approximately 1.1 μm, and wherein the light source produces and the video camera detects light having a wavelength greater than approximately 1.1 μm.

20. The method of claim 18, wherein the semiconductor material is gallium arsenide-based, wherein the enclosing mechanism eliminates light having a wavelength less than or equal to approximately 0.9 μm, and wherein the light source produces and the video camera detects light having a wavelength greater than approximately 0.9 μm.

21. A method for reducing electrolysis between metal features in semiconductor material comprising the steps of:
   a) limiting exposure of semiconductor material to light having a wavelength less than or equal to approximately 1.1 μm by stationing an enclosing mechanism about a semiconductor processing tool selected from the group consisting of a chemical mechanical polisher and a brush cleaner;
   b) illuminating the semiconductor processing tool only with a light source capable of producing light having a wavelength greater than approximately 1.1 μm;
   c) monitoring the semiconductor processing tool with a video camera capable of detecting light having a wavelength greater than approx. 1.1 μm; and
   d) associating with metal features in the semiconductor material at least one electrolysis inhibitor independently selected from the group consisting of blocking agents and poisoning agents, wherein any blocking agent is selected from the group consisting of high molecular weight surfactants and wherein any poisoning agent is selected from the group consisting of $Pb^{2+}$, $Bi^{3+}$, $Cd^{2+}$, $Sb^{3+}$, $As^{3+}$, and $Tl^{1+}$.

22. The method of claim 21, wherein the blocking agent is sodium octyl sulfate.

23. The apparatus of claim 21, wherein the poisoning agent is $Pb^{2+}$.

* * * * *